United States Patent [19]

Pigott et al.

[11] Patent Number: 5,057,879

[45] Date of Patent: Oct. 15, 1991

[54] NOISE REDUCTION TECHNIQUE FOR BREAKDOWN DIODES

[75] Inventors: John M. Pigott, Phoenix; Randall T. Wollschlager, Chandler, both of Ariz.

[73] Assignee: Motorola Inc., Schaumburg, Ill.

[21] Appl. No.: 632,834

[22] Filed: Dec. 24, 1990

[51] Int. Cl.⁵ .............................................. H01L 29/90
[52] U.S. Cl. .................................... 357/13; 357/23.13; 357/23.8; 357/41; 357/43; 357/7
[58] Field of Search ................. 357/13, 7, 23.13, 23.8, 357/41, 43, 13 R, 13 Z, 13 LM

[56] References Cited

U.S. PATENT DOCUMENTS

| | | | |
|---|---|---|---|
| 4,189,739 | 2/1980 | Copeland, III | 357/13 X |
| 4,322,767 | 3/1982 | El Hamamsy et al. | 357/13 X |
| 4,626,882 | 12/1986 | Cottrell et al. | 357/13 X |
| 4,847,724 | 7/1989 | Renous | 357/13 X |
| 5,012,317 | 4/1991 | Rountre | 357/13 X |

Primary Examiner—William Mintel
Attorney, Agent, or Firm—Bradley J. Botsch

[57] ABSTRACT

A device including a first semiconductor PN junction which is reverse biased to operate in the avalanche breakdown region. A second semiconductor PN junction is biased to operate in the forward active region such that carriers are injected through the second semiconductor PN junction and diffuse to the first semiconductor PN junction wherein the noise generated from the first semiconductor PN junction operating in the avalanche breakdown region is substantially reduced.

18 Claims, 1 Drawing Sheet

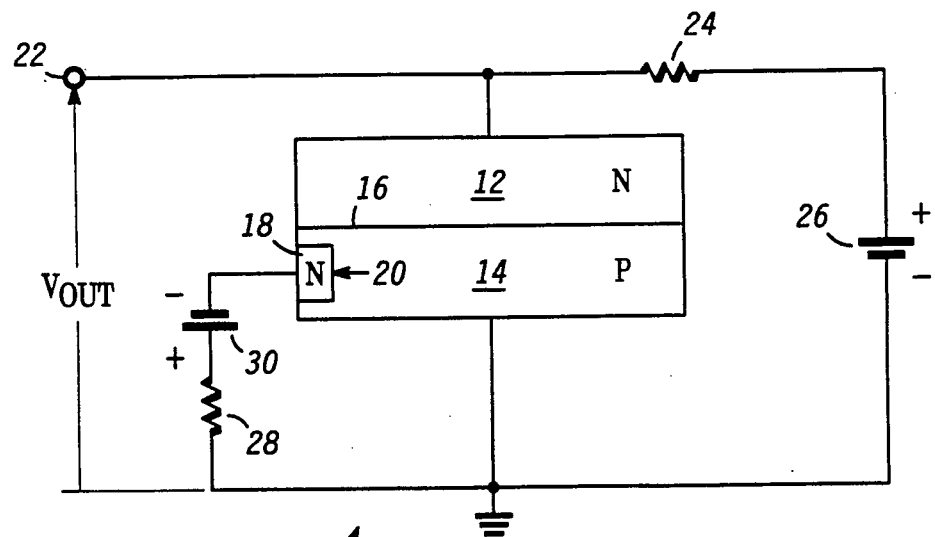
*FIG. 1*
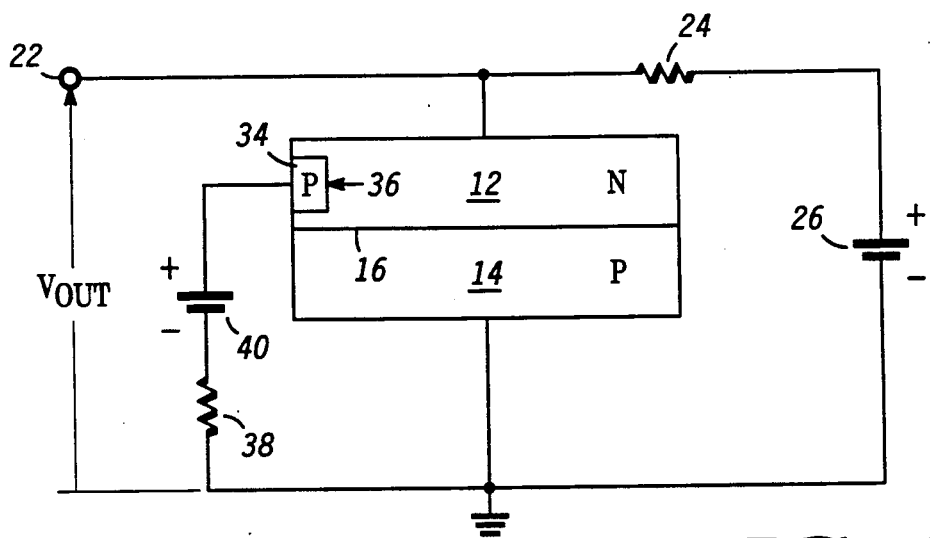
*FIG. 2*
*FIG. 3*
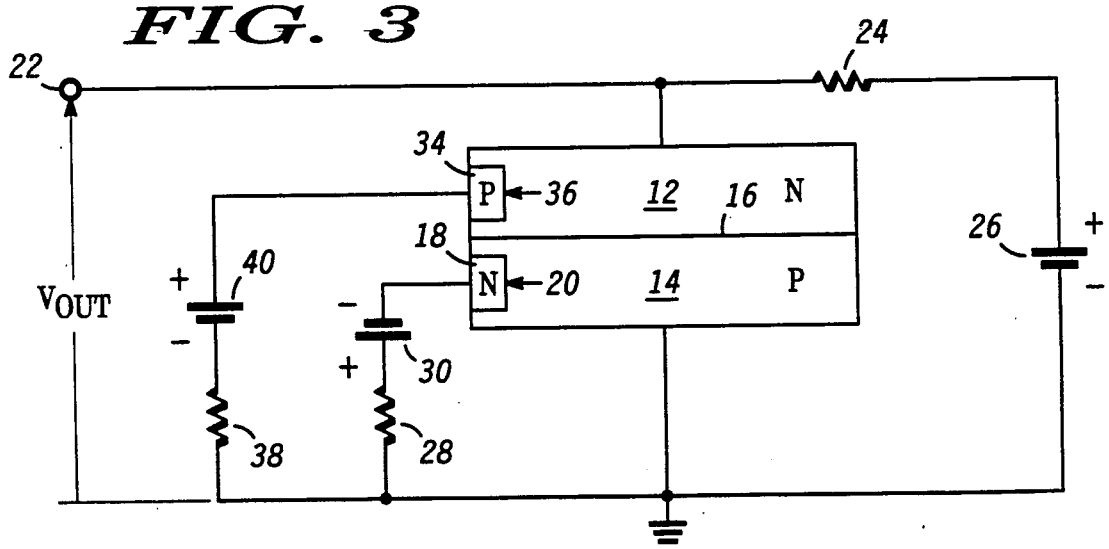

NOISE REDUCTION TECHNIQUE FOR BREAKDOWN DIODES

BACKGROUND OF THE INVENTION

This invention relates to diodes such as diodes operating in the avalanche breakdown region.

Any reverse biased PN junction has a small reverse current flow due to the presence of holes and electrons in the vicinity of the depletion region. These holes and electrons are swept across the depletion region by the applied electric field and contribute to the leakage current of the PN junction. As the reverse bias on the PN junction is increased, the applied electric field increases and the carriers acquire increasing amounts of energy. At a predetermined critical electric field, many of the carriers traversing the depletion region acquire sufficient energy to create new hole-electron pairs upon colliding with lattice atoms. This is called the avalanche multiplication process and leads to a large and sudden increase in the reverse bias current since the newly created carriers are also capable of producing new hole-electron pairs upon colliding with other lattice atoms. It should be noted that for a large reverse current to flow by avalanche breakdown, two conditions must exist: first, there must be sufficient reverse bias potential across the PN junction to create a sufficient electric field in the depletion region to support avalanche multiplication which enables holes and electrons to accelerate across the PN junction and, thus, create many additional carriers. Second, there must be carriers available in the vicinity of the PN junction to begin and sustain the avalanche breakdown process.

PN junctions operating in the avalanche region, as described above, are widely used as voltage references and are typically called zener diodes, but are more correctly called avalanche breakdown diodes. However, one major problem with zener diodes is that they exhibit large levels of noise, or short term variations in the breakdown current, when biased around their breakdown voltage. One simplistic approach for reducing the noise due to avalanche breakdown of a PN junction is to place a capacitor across the PN junction. In general, as the value of the capacitor increases, the level of the noise decreases. However, a large capacitor is difficult to fabricate on an integrated circuit and typically reduces the speed of the circuit.

Another approach for reducing the noise due to avalanche breakdown of a PN junction is to bias the PN junction at a higher current. However, this approach consumes a large amount of power while only slightly reducing the noise.

Hence, there exists a need for providing a PN junction device that operates in the avalanche breakdown region while having reduced noise characteristics.

SUMMARY OF THE INVENTION

Briefly, there is provided a device comprising a first semiconductor region having a first conductivity type; a second semiconductor region having a second conductivity type, the first and second semiconductor regions forming a first semiconductor junction, the first semiconductor junction being reversed biased to operate in an avalanche breakdown mode; and a third semiconductor region having the first conductivity type, the first and second semiconductor regions forming a second semiconductor junction, the second semiconductor junction being forward biased such that the third semiconductor region injects carriers into the second semiconductor region and the carriers subsequently diffuse to the first semiconductor junction wherein noise associated with the first semiconductor junction operating in the avalanche breakdown mode is substantially reduced.

It is an advantage of the present invention to provide a PN junction device having reduced noise characteristics while operating within the avalanche breakdown region. It is also an advantage of the present invention to provide a voltage reference circuit which includes a diode that operates in the avalanche breakdown mode for providing an output voltage having reduced noise characteristics.

The above and other features and advantages of the present invention will be better understood from the following detailed description taken in conjunction with the accompanying drawings.

BRIEF DESCRIPTION OF THE DRAWINGS

FIG. 1 is a detailed diagram illustrating a first embodiment of a diode in accordance with the present invention;

FIG. 2 is a detailed diagram illustrating a second embodiment of a diode in accordance with the present invention; and FIG. 3 is a detailed diagram illustrating a third embodiment of a diode in accordance with the present invention.

DETAILED DESCRIPTION OF THE PRESENT INVENTION

Referring the FIG. 1, a detailed diagram illustrating a first embodiment of diode 10 in accordance with the present is shown comprising N-type semiconductor region 12, P-type semiconductor region 14 and PN junction 16 formed between regions 12 and 14. It is understood that N-type semiconductor region 12 can be formed within P-type semiconductor region 14. Also, N-type semiconductor region 18 is formed within P-type semiconductor region 14 whereby PN junction 20 is formed. Region 12 has an electrode coupled to output terminal 22 and to a first terminal of resistor 24. The second terminal of resistor 24 is returned to ground reference through source of potential (or battery) 26. Also, region 14 has an electrode returned to ground reference. Region 18 has an electrode coupled to the first terminal of resistor 28 through source of potential (or battery) 30. Finally, the second terminal of resistor 28 is returned to ground reference.

The present invention provides a method for increasing the number of minority carriers in the vicinity of PN junction 16 prior to avalanche breakdown thereby helping to trigger the avalanche current-multiplying events. In other words, the present invention provides many additional carriers at PN junction 16 to be accelerated thereacross such that the noise associated with the avalanche breakdown of PN junction 16 is substantially reduced. Further, the present invention provides a circuit including a diode which operates in the avalanche breakdown mode for providing a reference voltage at an output.

In operation, PN junction 16 is biased by battery 26 and resistor 24 such that battery 26 supplies a predetermined reverse bias potential to PN junction 16 that is greater than the predetermined avalanche breakdown voltage of PN junction 16. Further, PN junction 20 is forward biased by battery 30 and resistor 28 such that N-type semiconductor region 18 injects electrons (minority carriers) into P-type semiconductor region 14 wherein at least some of the electrons subsequently diffuse to PN junction 16 thereby creating an increased number of electrons at PN junction 16. Thus, the two conditions required for avalanche breakdown exist: 1) there is a sufficient electric field as provided by reverse biasing PN junction 16 through battery 26, and 2) there are a sufficient number of the minority carriers present at PN junction 16 to initiate the avalanche breakdown process. Further, it must be understood that N-type semiconductor region 18 continuously injects electrons into P-type semiconductor region 14 thereby providing a sufficient number of electrons at PN junction 16 in order to sustain avalanche breakdown.

Due to N-type semiconductor region 18 injecting electrons into P-type semiconductor region 14, it must be realized that the noise associated with the avalanche breakdown of PN junction 16 is substantially reduced since there is always a large amount of minority carriers (electrons) available in P-type semiconductor region 14 to initiate and sustain avalanche breakdown. Without N-type semiconductor region 18 injecting electrons into P-type semiconductor region 14, the only electrons available at PN junction 16 are those few which are thermally generated. Therefore, the avalanche breakdown process occurs at various time intervals when the thermally generated electrons create enough carriers, by colliding with lattice atoms, to provide a sufficient number of minority carriers to initiate avalanche breakdown. Further, at each time interval when the avalanche process occurs, it is accompanied by large noise spikes of current through the PN junction. In contrast, the present invention substantially reduces the noise across PN junction 16 by continuously providing a sufficient number of minority carriers at PN junction 16 to initiate and sustain avalanche breakdown. In other words, the present invention does not rely on the thermally generated carriers to initiate breakdown. Instead, the present invention provides additional carriers at PN junction 16 to insure that avalanche breakdown is initiated and sustained thereby reducing the noise associated with PN junction 16 operating in its avalanche breakdown mode.

It should be realized that voltage $V_{OUT}$, which appears between output terminal 22 and ground reference, is a predetermined voltage due to the diode, formed from semiconductor regions 12 and 14, operating within its avalanche breakdown region. Further, since the noise associated with PN junction 16 is substantially reduced, it follows that the noise associated with voltage $V_{OUT}$ is also substantially reduced. Thus, a low noise reference voltage is provided at output terminal 22.

As an example, the output voltage of a SmartMOS 13 volt avalanche diode device was observed to have 6 volts peak-to-peak noise with a 50 microamp bias current flowing therethrough. However, when this same SmartMOS device included carrier injector means for increasing the number of carriers at its PN junction as described in the present invention, an astonishing result was observed. There was less than 34 millivolts of noise on the output voltage. Further, the SmartMOS device was biased at only 0.4 microamps with the carrier injector means as opposed to the aforementioned 50 microamps without the carrier injector means. Thus, by continuously providing a sufficient number of carriers at a PN junction which is operating in the avalanche breakdown region, a substantial reduction in noise is achieved.

It is worth noting that the present invention can easily be incorporated into a three-terminal integrated circuit device whereby the first terminal is coupled to the electrode of N-type semiconductor region 12, the second terminal is coupled to the electrode of P-type semiconductor region 14, and the third terminal is coupled to the electrode of N-type semiconductor region 18.

Referring to FIG. 2, a detailed diagram illustrating a second embodiment of a diode in accordance with the present invention is shown. It is understood that components similar to those of FIG. 1 are designated by similar reference numerals. The embodiment of FIG. 2 further comprises P-type semiconductor region 34 being formed within N-type semiconductor region 12 thereby forming PN junction 36. Further, region 34 has an electrode coupled to the first terminal of resistor 38 through battery 40. Also, the second terminal of resistor 38 is returned to ground reference.

The operation of the embodiment in FIG. 2 is similar to the operation of the embodiment in FIG. 1 wherein PN junction 36 is forward biased by battery 40 and resistor 38 such that P-type semiconductor region 34 injects holes (minority carriers) into N-type semiconductor region 12 which subsequently diffuse to PN junction 16 thereby creating a sufficient number of carriers at PN junction 16 to initiate the avalanche breakdown process. Further, it must be understood that P-type semiconductor region 34 continuously injects holes into N-type semiconductor region 12 thereby providing a sufficient number of carriers at PN junction 16 in order to sustain avalanche breakdown. Likewise, the embodiment of FIG. 2 substantially reduces the noise across PN junction 16 by providing a large number of carriers at PN junction 16 to initiate and sustain avalanche breakdown.

Referring to FIG. 3, a detailed diagram illustrating a third embodiment of a diode in accordance with the present invention is shown. It is understood that components similar to those of FIGS. 1 and 2 are designated by similar reference numerals. The embodiment of FIG. 3 includes both N-type semiconductor region 18 being formed within P-type semiconductor region 14 thereby forming PN junction 20, and P-type semiconductor region 34 being formed within N-type semiconductor region 12 thereby forming PN junction 36.

The operation of the embodiment of FIG. 3 is similar to the operation of the embodiment of FIG. 1 whereby N-type semiconductor region 18 functions to inject electrons into P-type semiconductor region 14 as aforedescribed for the embodiment of FIG. 1. In addition, the operation of the embodiment of FIG. 3 is similar to the operation of the embodiment of FIG. 2 whereby P-type semiconductor region 34 functions to inject holes into N-type semiconductor region 12 as aforedescribed for the embodiment of FIG. 2. Likewise to the embodiments of FIGS. 1 and 2, it must be understood that N-type semiconductor region 20 continuously injects electrons into P-type semiconductor region 14 while P-type semiconductor region 34 continuously injects holes into N-type semiconductor region 12 thereby providing a sufficient number of carriers at PN junction 16 in order to sustain avalanche breakdown. Therefore, the embodiment of FIG. 3 also substantially reduces the noise across PN junction 16 by providing a large number of carriers at PN junction 16 to initiate and sustain avalanche breakdown.

By now it should be apparent from the foregoing discussion that a novel method has been provided for reducing the noise associated with a PN junction operating within its avalanche breakdown region. Further, a novel circuit has been provided for providing a low noise reference voltage by utilizing a diode operating within its avalanche breakdown region.

We claim:

1. A semiconductor device, comprising:
   a first semiconductor region having a first conductivity type;
   a second semiconductor region having a second conductivity type, said first and second semiconductor regions forming a first semiconductor junction, said first semiconductor junction being reversed biased to operate in an avalanche breakdown mode; and
   a third semiconductor region having said first conductivity type, said second and third semiconductor regions forming a second semiconductor junction, said second semiconductor junction being forward biased such that said third semiconductor region injects carriers into said second semiconductor region and said carriers subsequently diffuse to said first semiconductor junction wherein noise associated with said first semiconductor junction operating in said avalanche breakdown mode is substantially reduced.

2. The semiconductor device according to claim 1 wherein said first conductivity type is N-type and said second conductivity type is P-type.

3. The semiconductor device according to claim 1 wherein said first conductivity type is P-type and said second conductivity type is N-type.

4. A circuit for providing an output voltage at an output, comprising:
   (a) a semiconductor device including:
      a first semiconductor region of a first conductivity type, said first semiconductor region having an electrode coupled to the output of the circuit;
      a second semiconductor region of a second conductivity type, said second semiconductor region having an electrode, said first and second semiconductor regions forming a first semiconductor junction; and
      a third semiconductor region of said first conductivity type, said third semiconductor region having an electrode, said second and third semiconductor regions forming a second semiconductor junction, said third semiconductor region being formed within said second semiconductor region;
   (b) a first source of potential having first and second terminals, said first terminal being coupled to said electrode of said first semiconductor region, said second terminal being coupled to said electrode of said second semiconductor region, said first source of potential providing a first predetermined voltage to bias said first semiconductor junction to operate in avalanche breakdown; and
   (c) a second source of potential having first and second terminals, said first terminal of said second source of potential being coupled to said electrode of said second semiconductor region, said second terminal of said second source of potential being coupled to said electrode of said third semiconductor region, said second source of potential providing a second predetermined voltage to forward bias said second semiconductor junction, said third semiconductor region injecting carriers into said second semiconductor region and said carriers diffusing to said first semiconductor junction wherein noise on the output voltage is substantially reduced.

5. The circuit according to claim 4 wherein said first semiconductor region is formed within said second semiconductor region.

6. The circuit according to claim 4 wherein said first conductivity type is N-type and said second conductivity type is P-type.

7. The circuit according to claim 4 further includes:
   a first resistor coupled between said electrode of said first semiconductor region and said first terminal of said first source of potential; and
   a second resistor coupled between said electrode of said second semiconductor region and said first terminal of said second source of potential.

8. A circuit for providing an output voltage at an output, comprising:
   (a) a semiconductor device including:
      a first semiconductor region of a first conductivity type, said first semiconductor region having an electrode coupled to the output of the circuit;
      a second semiconductor region of a second conductivity type, said second semiconductor region having an electrode, said first and second semiconductor regions forming a first semiconductor junction; and
      a third semiconductor region of said second conductivity type, said third semiconductor region having an electrode, said first and third semiconductor regions forming a second semiconductor junction, said third semiconductor region being formed within said first semiconductor region;
   (b) a first source of potential having first and second terminals, said first terminal being coupled to said electrode of said first semiconductor region, said second terminal being coupled to said electrode of said second semiconductor region, said first source of potential providing a first predetermined voltage to bias said first semiconductor junction to operate in avalanche breakdown; and
   (c) a second source of potential having first and second terminals, said first terminal of said second source of potential being coupled to said electrode of said third semiconductor region, said second terminal of said second source of potential being coupled to said electrode of said second semiconductor region, said second source of potential providing a second predetermined voltage to forward bias said second semiconductor junction, said third semiconductor region injecting carriers into said first semiconductor region and said carriers diffusing to said first semiconductor junction wherein noise on the output voltage is substantially reduced.

9. The circuit according to claim 8 wherein said second semiconductor region is formed within said first semiconductor region.

10. The circuit according to claim 8 further includes:
    a first resistor coupled between said electrode of said first semiconductor region and said first terminal of said first source of potential; and a second resistor coupled between said second terminal of said second source of potential and said electrode of said second semiconductor region.

11. The circuit according to claim 8 wherein said first conductivity type is N-type and said second conductivity type is P-type.

12. A circuit for providing an output voltage at an output, comprising:
(a) a semiconductor device including:
a first semiconductor region of a first conductivity type, said first semiconductor region having an electrode coupled to the output of the circuit;
a second semiconductor region of a second conductivity type, said second semiconductor region having an electrode, said first and second semiconductor regions forming a first semiconductor junction; and
a third semiconductor region of said first conductivity type, said third semiconductor region having an electrode, said second and third semiconductor regions forming a second semiconductor junction, said third semiconductor region being formed within said second semiconductor region;
a fourth semiconductor region of said second conductivity type, said fourth semiconductor region having an electrode, said first and fourth semiconductor regions forming a third semiconductor junction, said fourth semiconductor region being formed within said first semiconductor region;
(b) a first source of potential having first and second terminals, said first terminal being coupled to said electrode of said first semiconductor region, said second terminal being coupled to said electrode of said second semiconductor region, said first source of potential providing a first predetermined voltage to bias said first semiconductor junction to operate in avalanche breakdown;
(c) a second source of potential having first and second terminals, said first terminal of said second source of potential being coupled to said electrode of said second semiconductor region, said second terminal of said second source of potential being coupled to said electrode of said third semiconductor region, said second source of potential providing a second predetermined voltage to forward bias said second semiconductor junction, said third semiconductor region injecting carriers into said second semiconductor region and said carriers diffusing to said first semiconductor junction; and
(d) a third source of potential having first and second terminals, said first terminal of said third source of potential being coupled to said electrode of said fourth semiconductor region, said second terminal of said third source of potential being coupled to said electrode of said second semiconductor region, said third source of potential providing a third predetermined voltage to forward bias said third semiconductor junction, said fourth semiconductor region injecting carriers into said first semiconductor region and said carriers diffusing to said first semiconductor junction wherein noise on the output voltage is substantially reduced.

13. The circuit according to claim 12 further includes:
a first resistor coupled between said electrode of said first semiconductor region and said first terminal of said first source of potential;
a second resistor coupled between said first terminal of said second source of potential and said electrode of said second semiconductor region; and
a third resistor coupled between said second terminal of said third source of potential and said electrode of said second semiconductor region.

14. The circuit according to claim 12 wherein said first conductivity type is N-type and said second conductivity type is P-type.

15. A voltage reference device in a three-terminal package, comprising:
a first semiconductor region having a first conductivity type, said first semiconductor region having an electrode coupled to a first terminal of the voltage regulator device for providing an output voltage;
a second semiconductor region having a second conductivity type, said first and second semiconductor regions forming a first semiconductor junction, said second semiconductor region having an electrode coupled to a second terminal of the voltage regulator device, said first semiconductor junction being reversed biased to operate in an avalanche breakdown mode; and
a third semiconductor region having said first conductivity type, said third semiconductor region having an electrode coupled to a third terminal of the voltage regulator device, said second and third semiconductor regions forming a second semiconductor junction, said second semiconductor junction being forward biased such that said third semiconductor region injects carriers into said second semiconductor region and said carriers subsequently diffuse to said first semiconductor junction wherein noise associated with said first semiconductor junction operating in said avalanche breakdown mode is substantially reduced.

16. The voltage reference device according to claim 15 wherein said first conductivity type is N-type and said second conductivity type is P-type.

17. The voltage reference device according to claim 15 wherein said first conductivity type is P-type and said second conductivity type is N-type.

18. A method for reducing the noise during avalanche breakdown of a PN junction, the method comprising the steps of:
forming a first PN junction that is reversed biased to operate in avalanche breakdown;
forming a second PN junction that is forward biased; and
injecting carriers from said second PN junction to said first PN junction such that noise resulting from said avalanche breakdown of said first PN junction is substantially reduced.

* * * * *